United States Patent [19]

Yabe et al.

[11] Patent Number: 5,504,709
[45] Date of Patent: Apr. 2, 1996

[54] SEMICONDUCTOR MEMORY DEVICE

[75] Inventors: Tomoaki Yabe, Kawasaki; Katsuhiko Sato; Shinji Miyano, both of Yokohama, all of Japan

[73] Assignee: Kabushiki Kaisha Toshiba, Kawasaki, Japan

[21] Appl. No.: 354,831

[22] Filed: Dec. 8, 1994

[30] Foreign Application Priority Data

Dec. 10, 1993 [JP] Japan ................... 5-310175

[51] Int. Cl.[6] ................................. G11C 11/34
[52] U.S. Cl. ........................... 365/189.05; 365/190
[58] Field of Search ................ 365/189.05, 190, 365/202, 222, 230.08

[56] References Cited

U.S. PATENT DOCUMENTS 5,220,527  6/1993  Ohsawa ..................... 365/189.05
5,309,389  5/1994  Golke et al. ................ 365/189.05 X

OTHER PUBLICATIONS

Publication, "A 100–MHz 4–Mb Cache DRAM with Fast Copy–Back Scheme", Katsumi Dosaka et al., *IEEE Journal of Solid–State Circuits*, vol. 27, No. 11, November 1992.

Primary Examiner—Joseph A. Popek
Attorney, Agent, or Firm—Banner & Allegretti, Ltd.

[57] ABSTRACT

A semiconductor memory device includes a sense amplifier which senses data read out from a memory cell, a transfer gate coupled to an output of the sense amplifier, and a data latch circuit coupled to the transfer gate. The data latch circuit includes two MOS transistors of a same conductivity type connected in series between a pair of I/O data lines. The gates of the two MOS transistors are cross-coupled to the data lines respectively, thereby enabling a rapid data transfer between the memory cell and a data bus.

6 Claims, 13 Drawing Sheets

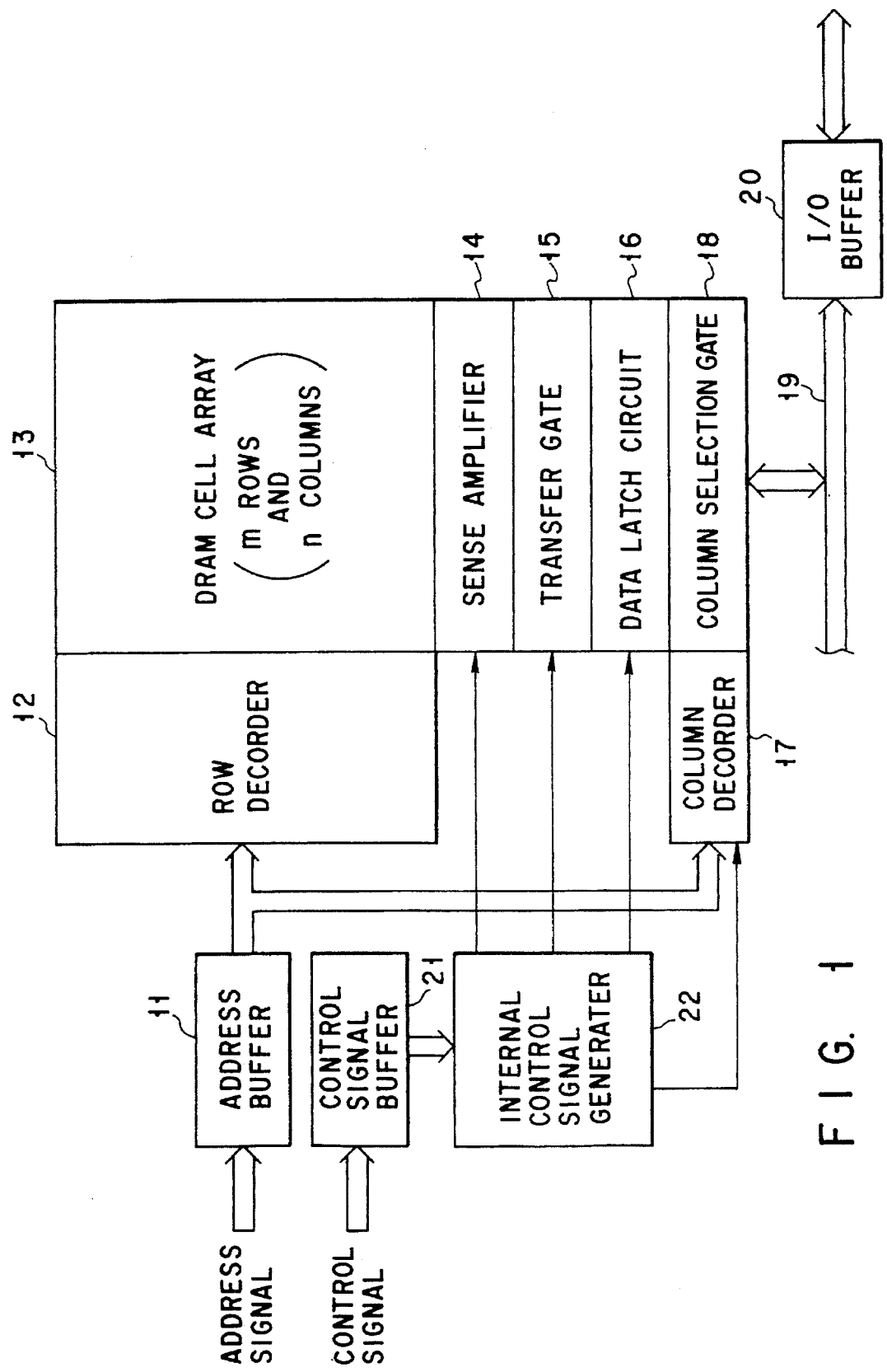
F I G. 1

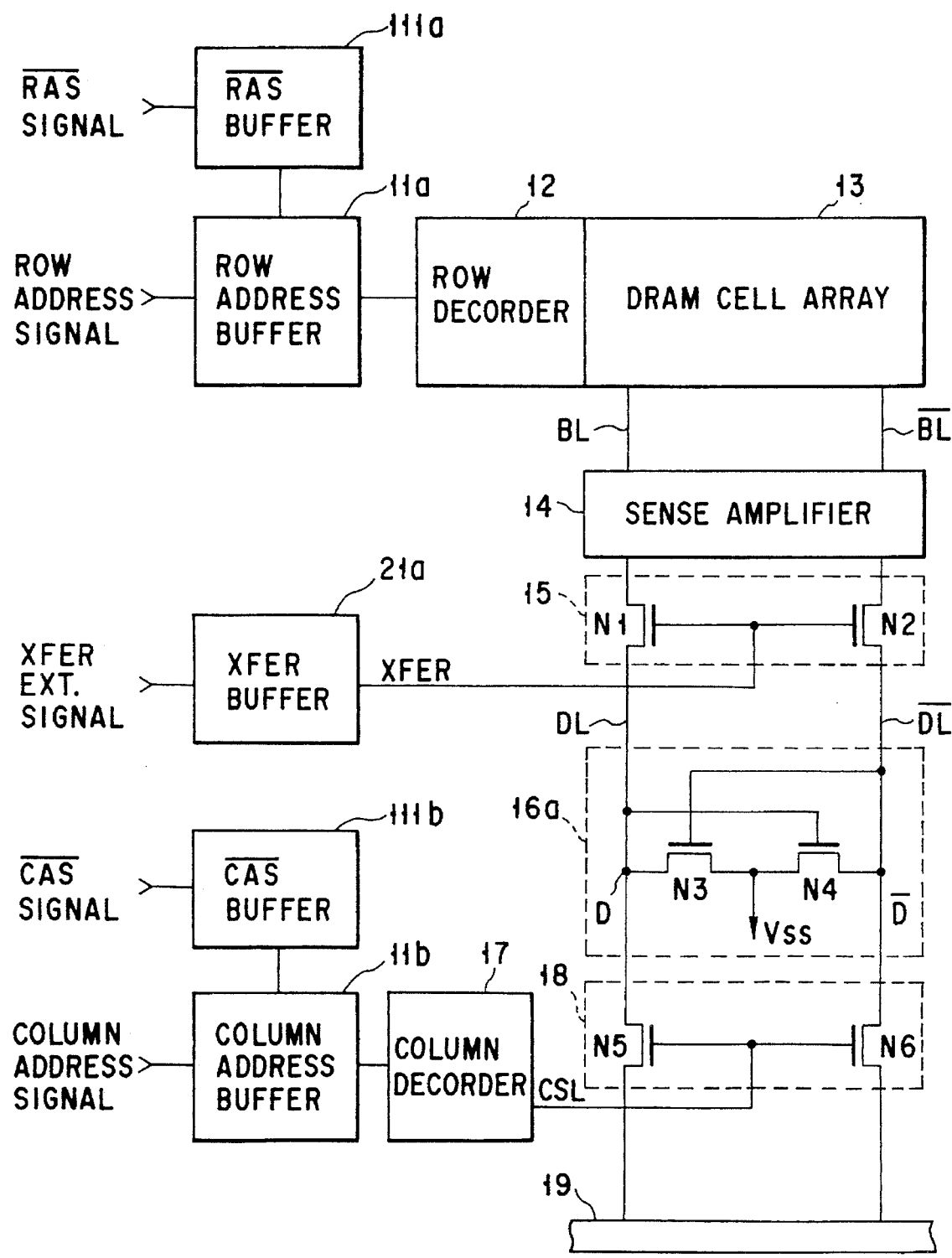
F I G. 3

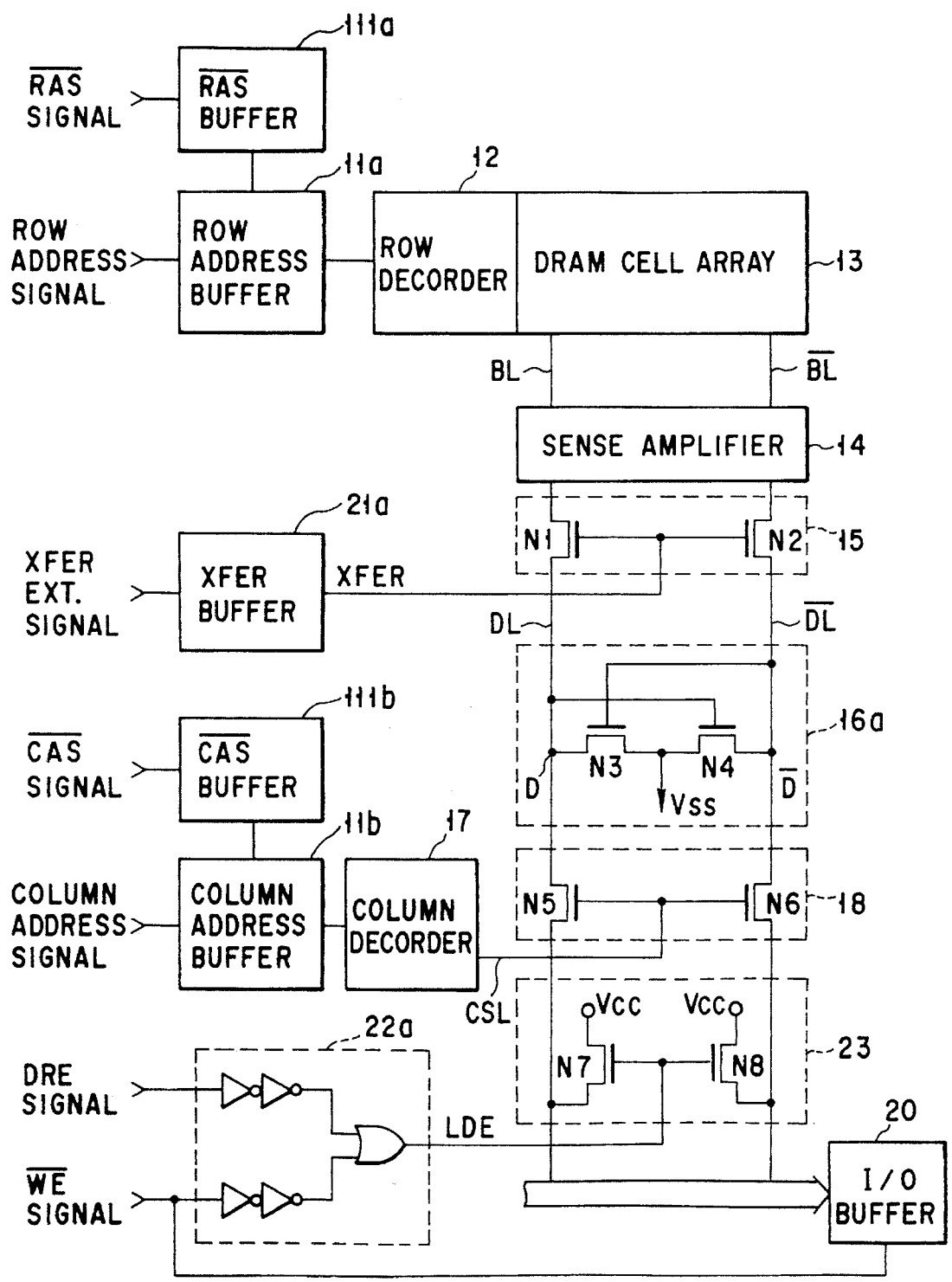
F I G. 5

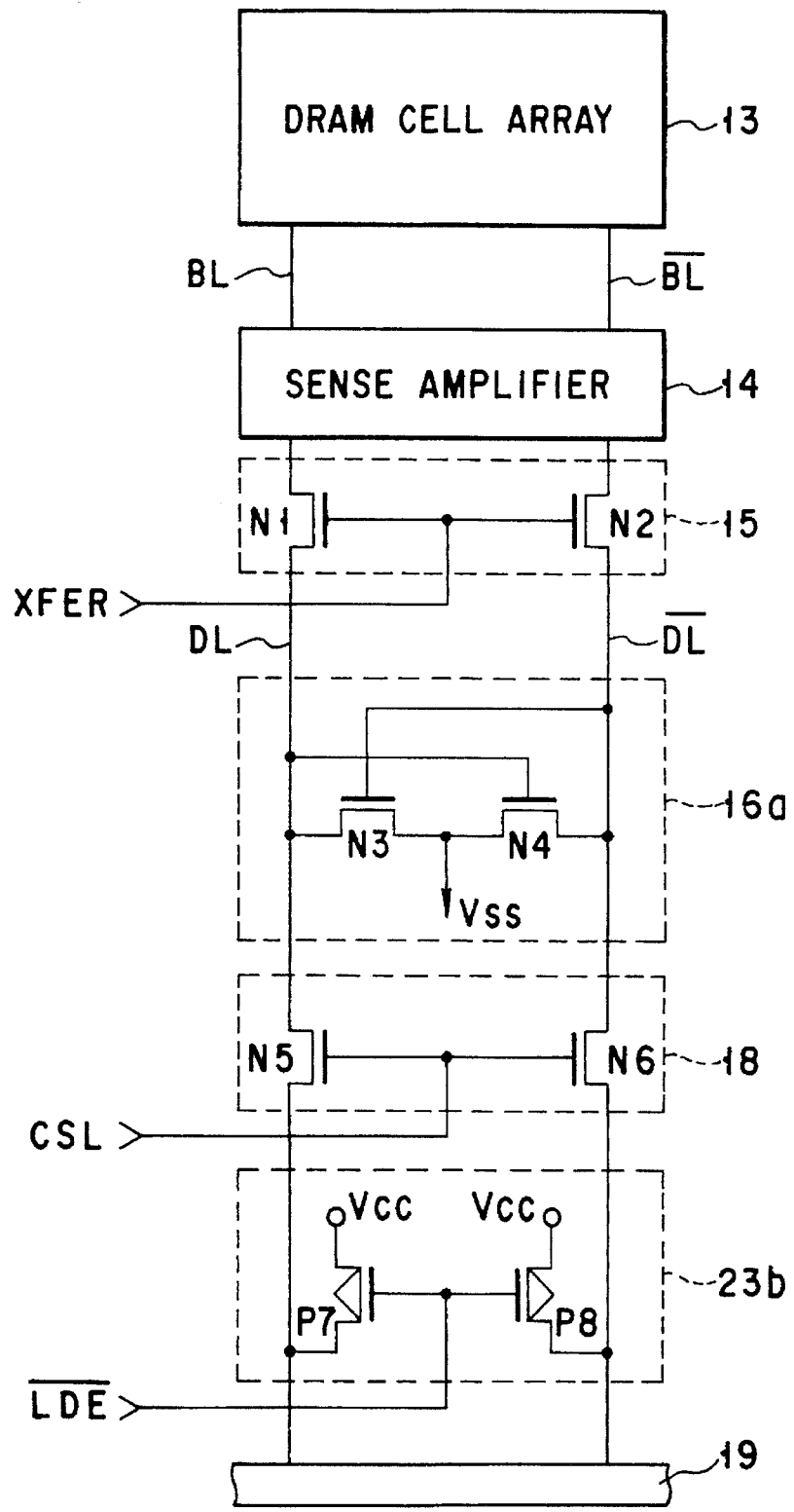
F I G. 7

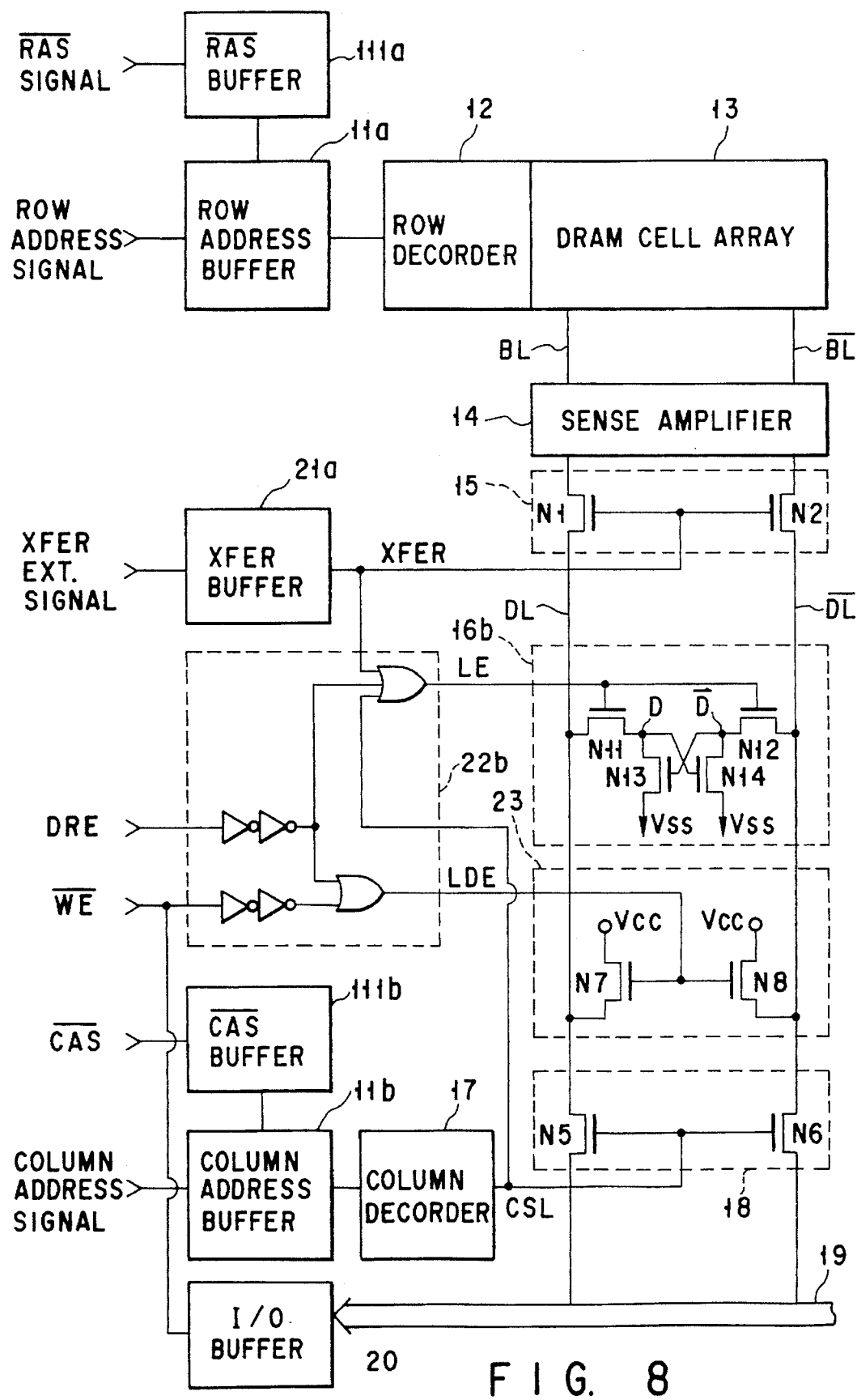
F I G. 8

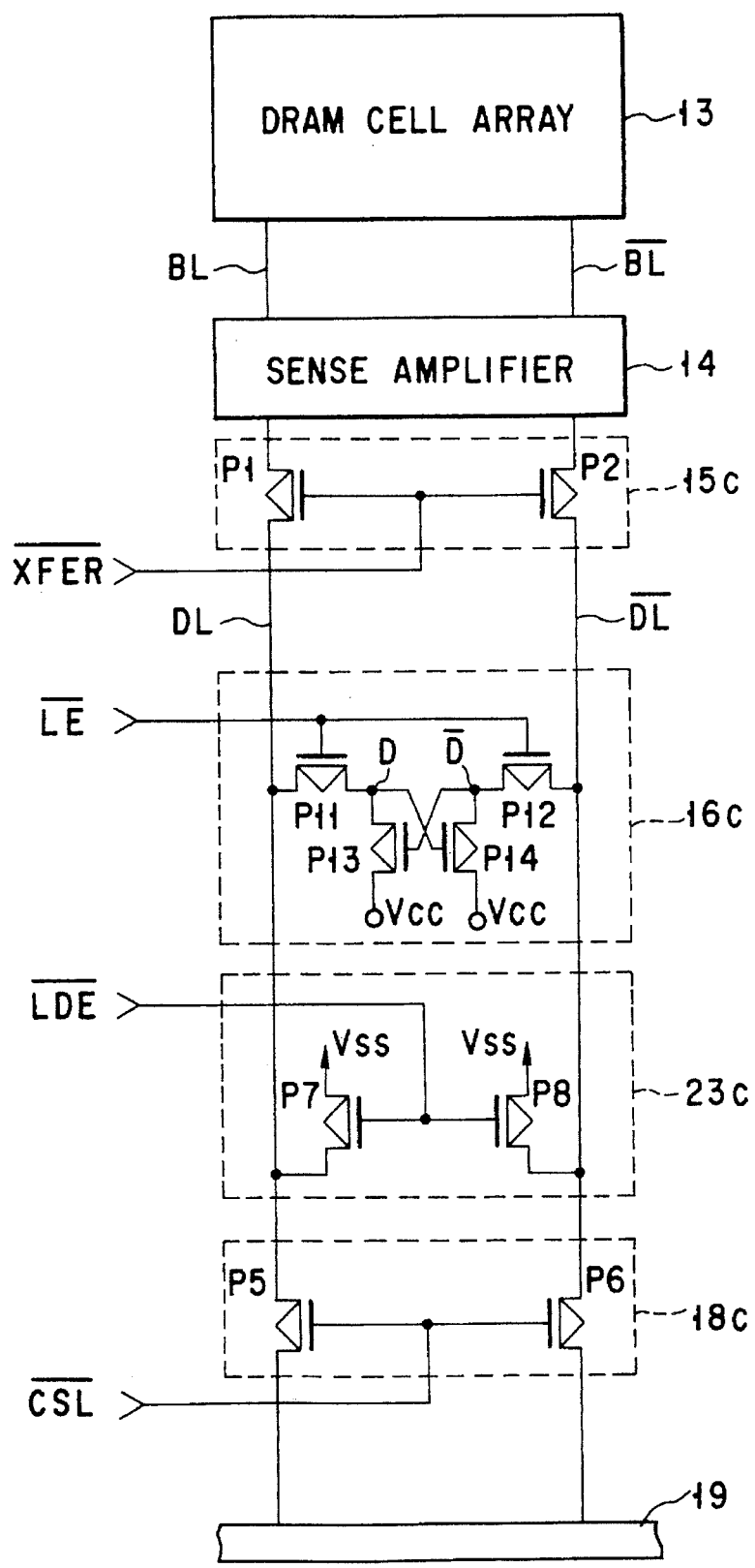
F I G. 10

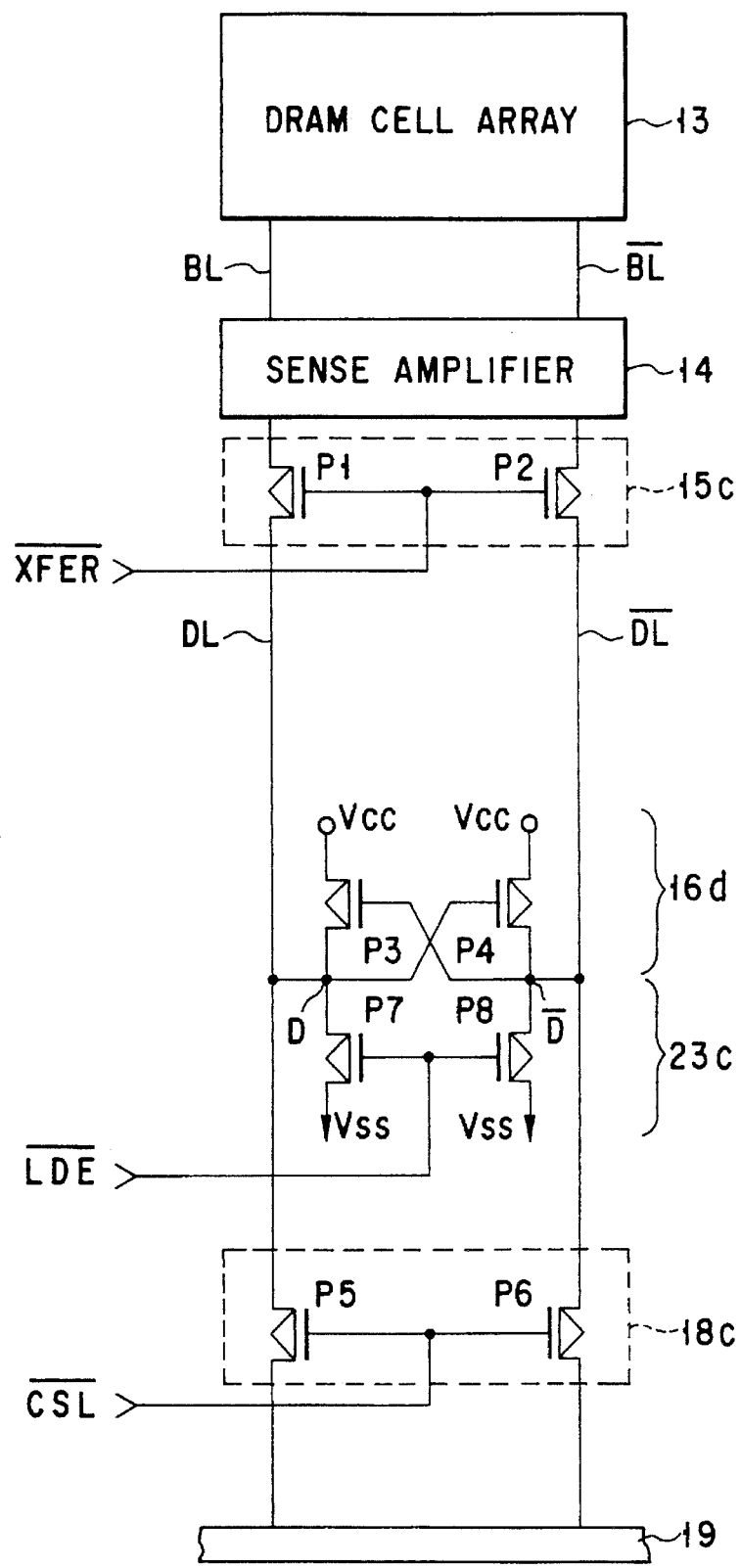
F I G. 12

SEMICONDUCTOR MEMORY DEVICE

BACKGROUND OF THE INVENTION

1. Field of the Invention

This invention relates to a semiconductor memory device, and more particularly to a data latching type dynamic random access memory (DRAM) which has a data latching circuit provided at a stage succeeding to a sense amplifier for sensing readout data from a memory cell and which transfers data between the data latching circuit and a data bus at high speed.

2. Description of the Related Art

As the integrated circuit technology is increasingly developed, semiconductor memory devices, especially DRAMs are widely used in the electronics field. Since the memory capacity of the DRAM can be made larger, the application thereof to memories such as an image memory which requires a large memory capacity is developed, but in this application field, it is necessary to read out stored data successively and at high speed. When reading out memory data, the most important factor for determining the readout time is time for readout of data from a memory cell to a sense amplifier. Therefore, various attempts are made to apparently eliminate the readout time. For example, a DRAM with data latch is provided in which a latch circuit is connected between the sense amplifier and the I/O buffer and a readout data is temporarily held in the latch circuit.

FIG. 1 shows part of the general construction of the DRAM with data latch. The DRAM with data latch has a construction in which a data latch circuit is provided at a stage next to the sense amplifier in the memory core portion of a standard DRAM. That is, in FIG. 1, 11 denotes an address buffer, 12 a row decoder, 13 a DRAM cell array, 14 sense amplifiers, 15 transfer gates, 16 data latch circuits, 17 a column decoder, 18 column selection gates, 19 a data bus, 20 an input/output buffer, 21 a control signal buffer, and 22 an internal control signal generator.

If the DRAM cell array 13 has a construction of m rows×n columns, n data latch circuits 16, that is, data latch circuits of a number capable of holding data of one row are arranged. This construction is similar to that in which the cache portion of a Cache DRAM is constructed by a data latch circuit of m rows× n columns.

Next, the operation of the DRAM with data latch is explained. In the readout operation, when an address signal is input and a word line (not shown) selected by the row decoder 12 is activated, n data items (data items on the same row) are read out from DRAM cells (not shown) corresponding to the selected word line to the sense amplifiers 14 and respectively latched therein. Further, the transfer gates 15 between the sense amplifiers 14 and the data latch circuits 16 are turned on by a control signal generated from the internal control signal generator 22 and data items latched by the sense amplifiers 14 are transferred to the respective data latch circuits 16. Then, latch data in the data latch circuit 16 is output to an external data bus via one of the column selection gates 18 selected by the column decoder 17, data bus 19 and input/output buffer 20.

In the above operation, the transfer gates 15 are turned off when data is transferred to the data latch circuit 16 so as to permit the DRAM cell array 13 and sense amplifiers 14 to be operated independently from the data latch circuits 16 and the succeeding stage circuits. Based on this fact, a next row address signal is input while data on the same row is transferred between the data latch circuit 16 and the data bus 19. If new data items on the same row corresponding to the new row address are read out from the DRAM cell array 13 to the sense amplifiers 14, it becomes possible to transfer the new data items from the sense amplifiers 14 to the data latch circuits 16 by turning on the transfer gates 15 again when transfer of latch data from the data latch circuit 16 to the external data bus is completed.

As a result, when viewing the DRAM from the external data bus side, the time (which is normally 50 ns or more) necessary for reading out data corresponding to the row address input from the DRAM cell array 13 to the sense amplifiers 14 is apparently eliminated. That is, it has an advantage that new data can be read out from the data latch circuit 16 again when a short period of time (which is normally 10 ns or less) necessary for turning off the transfer gates 15 has elapsed after the transfer gates 15 are turned on to transfer previous data items from the sense amplifiers 15 to the data latch circuits 16.

FIG. 2 shows the conventional construction corresponding to one column of the DRAM cell array in FIG. 1 and including a bit line pair (BL, /BL), sense amplifier 14, transfer gate 15, data input/output lines (DL, /DL), data latch circuit 16 and column selection gate 18. In FIG. 2, N1 and N2 denote NMOS transistors of the transfer gate, XFER denotes a control signal for the transfer gate, N5 and N6 denote NMOS transistors of the column selection gate, and CSL denotes a control signal for the column selection gate.

Conventionally, as the data latch circuit 16, a static latch circuit as shown in the drawing is used. The static latch circuit includes a P type latch circuit constructed by PMOS transistors P3, P4 and an N type latch circuit constructed by NMOS transistors N3, N4. DBP denotes an activation signal for the P type latch circuit, /DBN denotes an activation signal for the N type latch circuit, and the states of DL, /DL are latched when the former is changed from "L" to "H" and the latter changes from "H" to "L".

The static latch circuit 16 has an advantage that the refreshing operation for the latching operation is not necessary since latched data is not lost with an elapse of time, but since the PMOS transistors P3, P4 and NMOS transistors N3, N4 are used, an isolation region for electrically isolating an N well for forming a PMOS transistor from a P well for forming an NMOS transistor becomes necessary, thereby significantly increasing the chip size of the DRAM.

As described above, in the conventional DRAM with data latch, the static latch circuit is used and the isolation region for isolation between the N well for forming the PMOS transistor and the P well for forming the NMOS transistor is necessary, thereby causing a problem that the chip size of the DRAM is significantly increased.

SUMMARY OF THE INVENTION

An object of this invention is to provide a semiconductor memory device having a dynamic data latch circuit which is free from a problem that the chip size of the DRAM is significantly increased.

Further, another object of this invention is to provide a semiconductor memory device having a dynamic data latch circuit which is free from a problem that the chip size of the DRAM is significantly increased and in which refresh control for latch data is simple.

In order to attain the above object, a semiconductor memory device of this invention comprises a memory cell array having a plurality of dynamic memory cells arranged in a matrix form of rows and columns; a row decoder for selecting any one of the rows in the memory cell array; a plurality of sense amplifiers each for sensing a pair of data items read out from a corresponding one of the plurality of memory cells on a row selected by the row decoder; a plurality of transfer gates each including a pair of first MOS transistors respectively connected to a pair of outputs of a corresponding one of the plurality of sense amplifiers; a plurality of input/output data line pairs connected to the plurality of transfer gates; a plurality of data latch circuits each connected between two lines of a corresponding one of the plurality of input/output data line pairs, for latching data in the input/output data line pairs; a plurality of column selection gates each including a pair of second MOS transistors being of the same conductivity type as the first MOS transistors and connected to a corresponding one of the plurality of input/output data line pairs, for selecting any one of the plurality of data latch circuits; a data bus connected to the plurality of input/output data line pairs via the column selection gates; and an input/output buffer connected to the data bus, for transferring input/output data with respect to the data latch circuit selected by the column selection gate; wherein each of the data latch circuits includes third and fourth transistors whose drains are connected to the input/output data line pair, whose sources are connected to a power supply node and whose gates are cross-coupled to the drains of the fourth and third MOS transistors, and the third and fourth MOS transistors are of the same conductivity type as the first and second MOS transistors.

Further, in a preferable embodiment, a control circuit is further provided which causes data of the same row address as that of data latched in the data latch circuit to be read out from the memory cell array and latched by the sense amplifier and causes data latched by the sense amplifier to be written into the data latch circuit by controlling the first MOS transistors for the transfer gate into the ON state while controlling the second MOS transistors for the column selection gate into the OFF state to isolate the data latch circuit and the data bus from each other in the refreshing operation of latch data by the data latch circuit.

Since the data latch circuit is constructed by the MOS transistors of the same conductivity type and MOS transistors of a different conductivity type are not used, an isolation region for electrically isolating the MOS transistors of different conductivity types from each other is not necessary. Further, the data latch circuit is made simple in construction obtained by cross-coupling two MOS transistors. The data latch circuit will not cause a significant increase in the chip size of the DRAM.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a block diagram showing the main portion of a general construction of a DRAM with data latch;

FIG. 3 is a circuit diagram (partially block diagram) showing an example of a sense amplifier, transfer gate, data input/output line, data latch circuit, column selection gate and a control circuit for controlling the above elements in one column of a DRAM cell array according to a first embodiment of this invention;

FIG. 5 is a circuit diagram (partially block diagram) showing an example of a sense amplifier, transfer gate, data input/output line, data latch circuit, column selection gate, load circuit and a control circuit for controlling the above elements in one column of a DRAM cell array according to a second embodiment of this invention;

FIG. 7 is a circuit diagram (partially block diagram) showing an example of a sense amplifier, transfer gate, data input/output line, data latch circuit, column selection gate, and load circuit in one column of a DRAM cell array according to a third embodiment of this invention;

FIG. 8 is a circuit diagram (partially block diagram) showing an example of a sense amplifier, transfer gate, data input/output line, data latch circuit, column selection gate, load circuit and a control circuit for controlling the above elements in one column of a DRAM cell array according to a fourth embodiment of this invention;

FIG. 10 is a circuit diagram (partially block diagram) showing an example of a sense amplifier, transfer gate, data input/output line, data latch circuit, column selection gate, and load circuit in one column of a DRAM cell array according to a fifth embodiment of this invention;

FIG. 12 is a circuit diagram (partially block diagram) showing an example of a sense amplifier, transfer gate, data input/output line, data latch circuit, column selection gate, and load circuit in one column of a DRAM cell array according to a seventh embodiment of this invention.

DETAILED DESCRIPTION OF THE PREFERRED EMBODIMENTS

Figure 2:
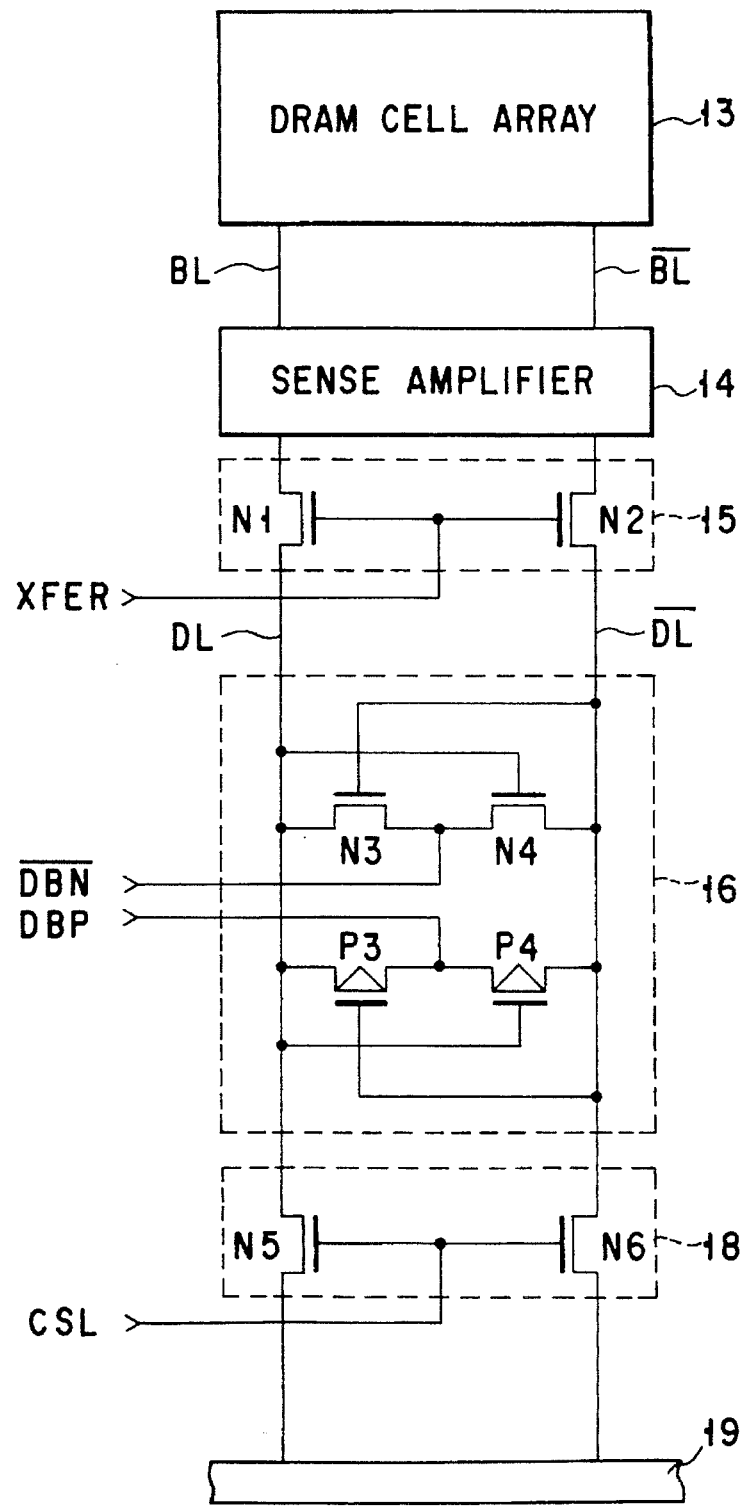
FIG. 2 is a circuit diagram (partially block diagram) showing an example of a sense amplifier, transfer gate, data input/output line, data latch circuit and column selection gate corresponding to one column of the conventional DRAM cell array with data latch.

There will now be described an embodiment of this invention with reference to the accompanying drawings. In the following description, portions which are the same in the embodiments are denoted by the same reference numerals and the repetitive explanation therefor is omitted.
(Embodiment 1)

The construction of the main portion of a DRAM with latch circuit according to a first embodiment of this invention is shown in FIG. 1 and a data latch circuit connected to a bit line pair in one column of the cell array of the DRAM and other circuits associated therewith are shown in FIG. 3.

In FIG. 1, reference number 13 denotes a memory cell array (DRAM cell array) having dynamic memory cells arranged in a matrix form of rows and columns. Reference number 11 denotes an address buffer, and reference number 12 denotes a row decoder for selecting any one of the rows in the DRAM cell array according to a row address signal.

Reference number 14 denotes a plurality of sense amplifiers for sensing data items read out from a plurality of memory cells on a row selected by the row decoder 11. Reference number 16 denotes a plurality of data latch circuits respectively connected to a plurality of input/output data line pairs (DL, /DL in FIG. 3) which are respectively connected to the plurality of sense amplifiers 14, for latching data items of the input/output data line pairs. In this case, if the DRAM cell array 13 is constructed in a matrix form of m rows and n columns, the data latch circuits 16 of a number (which is the same as the number of columns of the DRAM cell array) for holding n data items, that is, data items of one row are provided.

Reference number 15 denotes transfer gates respectively connected to the input/output data line pairs between the plurality of data latch circuits 16 and the plurality of sense amplifiers 14, reference number 18 denotes column selection gates respectively connected to the input/output data line pairs on the data latch circuit side with respect to the transfer gates 15, for selecting any one of the plurality of data latch circuits 16, and reference number 17 denotes a column decoder for controlling the column selection gates 18 according to a column address signal.

Reference number 20 denotes an input/output buffer for transferring input/output data with respect to the data latch circuit 16 selected by the column selection gate 18, and reference number 19 denotes a data bus for connecting the input/output buffer 20 to the column selection gate 18.

Reference number 21 denotes a control signal buffer, and reference number 22 denotes an internal control signal generator for generating internal control signals used to control the sense amplifier 14, transfer gate 15, data latch circuit 16 and column decoder 17 when required.

The detailed description of the above-mentioned blocks in FIG. 1 will be given referring to FIG. 3. FIG. 3 shows an example of the construction of a bit line pair (BL, /BL), sense amplifier 14, transfer gate 15, data input/output lines (DL, /DL), data latch circuit 16 and column selection gate 18 in one column of the DRAM cell array of FIG. 1, and a dynamic data latch circuit 16a is used as the data latch circuit in this embodiment. N1 and N2 denote NMOS transistors of the transfer gate, XFER denotes a control signal for the transfer gate, N5 and N6 denote NMOS transistors of the column selection gate, and CSL denotes a control signal for the column selection gate.

Further, a control circuit for supplying signals to the above circuits is shown in FIG. 3. The row address signal is input to a row address buffer 11a and distributed to the row decoder 12 by a /RAS (row and address strobe) signal via a /RAS buffer 111a. The column address signal is input to a column address buffer 11b, distributed to the column decoder 17 by a /CAS (column and address strobe) signal via a /CAS buffer 111b, and then input to the CSL and column selection gate 18. An XFER external signal is input to the gate of the transfer gate 15 via an XFER buffer 21a as the XFER signal.

In the dynamic latch circuit 16a, the two NMOS transistors N3 and N4 are cross-coupled between the paired data input/output lines DL and /DL. That is, the drains of the NMOS transistors N3 and N4 are respectively connected to the data input/output lines DL and /DL, the gates of the NMOS transistors N3 and N4 are cross-coupled to the drains of the NMOS transistors N4 and N3, and the sources thereof are connected to the ground potential (VSS) node.

Figure 4:
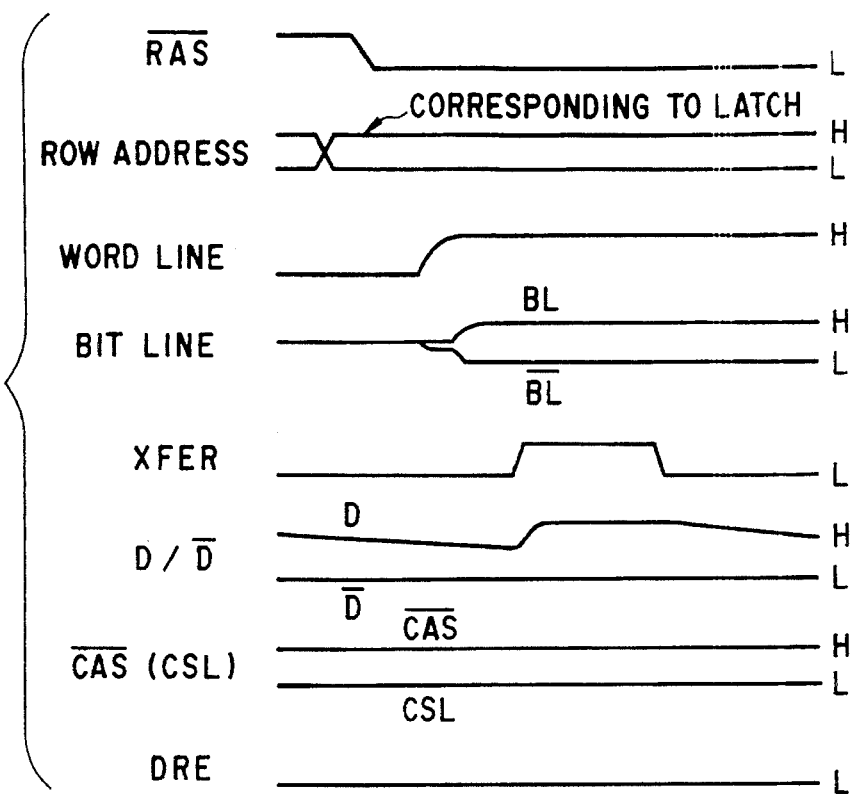
FIG. 4 is a timing chart for illustrating the refreshing operation of the data latch circuit of the first embodiment.

Since data held in the dynamic latch circuit 16a is gradually lost with an elapse of time, the operation of refreshing latch data (re-latching operation) is required as in the case of DRAM cell. The latch data refreshing operation is effected as shown in the timing chart of FIG. 4. That is, at the time of refreshing operation of the data latch circuit 16a, data latched so far in the sense amplifier 14 is destroyed, the row address for the data latched so far in the data latch circuit 16a is designated to read out data of the row address from the DRAM cell array 13 into the bit line pair BL, /BL and latch the data into the sense amplifier 14. Thus, the normal refreshing operation for a memory cell (not shown) of the DRAM cell array 13 is effected.

Next, the MOS transistors N1 and N2 for the transfer gate are set into the ON state by setting the control signal XFER for the transfer gate to VCC ("H" level) so as to write data latched by the sense amplifier 14 into the data latch circuit 16a. At this time, the data latch circuit 16 and the data bus 19 are isolated from each other by previously setting the MOS transistors N5 and N6 for the column selection gate into the OFF state by setting the control signal CSL for the column selection gate to the "L" level.

As a result, the potential of one of the first data storing and holding node D (the drain of the NMOS transistor N3) and the second data storing and holding node /D (the drain of the NMOS transistor N4) in the dynamic latch circuit 16a which is set at a higher potential than the other is charged to VCC-VTN1 (VTN1 is a gate threshold voltage of the MOS transistors N1 and N2 for the transfer gate).

If it is required to latch original data latched so far in the sense amplifier 14 into the sense amplifier 14 again after completion of the refreshing operation of the latch circuit, data of the same row address as that of data latched so far is read out from the DRAM cell array 13 to the bit line pair BL, /BL and then latched into the sense amplifier 14.

Further, when a modification is made to supply a latch control signal (not shown) to the sources of the two NMOS transistors N3 and N4 of the dynamic latch circuit 16a, it is only necessary to set the latch control signal to the "L" level at the time of data latch operation. That is, at the time of latch data refreshing operation, the latch control signal may be kept set at the "L" level, or it is possible to set the MOS transistors N1 and N2 for the transfer gate into the ON state, and at the same time, temporarily set the latch control signal to the "H" level to set the data latch circuit 16a into the de-activated state, and return the latch control signal to the "L" level after data latched by the sense amplifier 14 is transferred to the data latch circuit 16a so as to latch the data.

If the gate potentials of the MOS transistors N1 and N2 for the transfer gate are controlled by the internal control signal generator so as to be raised to a potential (for example, VCC+VTN1) higher than VCC, the potential of one of the two data storing and holding nodes D and /D in the latch circuit 16a which is higher than the other is set to VCC to enhance the write-in margin.

(Embodiment 2)

Figure 6:
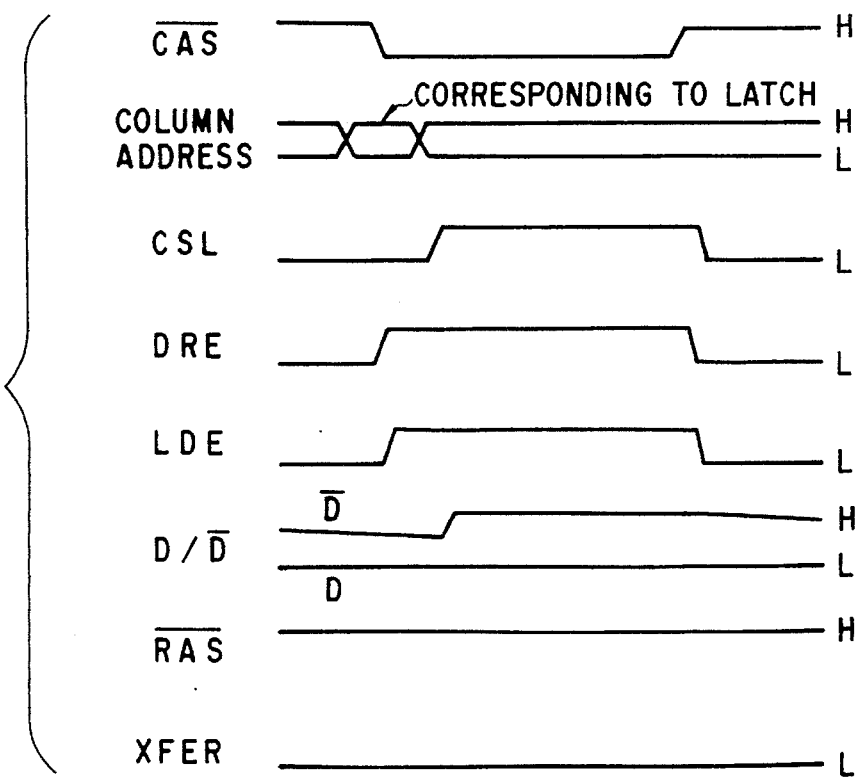
FIG. 6 is a timing chart for illustrating the refreshing operation of the data latch circuit of the second embodiment.

The second embodiment of this invention is a modification obtained by adding a load circuit to the first embodiment and changing the refreshing system of the latch circuit. The construction of the main portion of the DRAM cell array of this embodiment is the same as that of FIG. 1, circuits connected to one bit line pair in one column of the cell array are shown in FIG. 5, and the timing chart for illustrating the refreshing operation thereof is shown in FIG. 6.

The circuit construction of FIG. 5 is similar to that of FIG. 3 except that a load circuit 23 and a partial circuit 22a of the internal control signal generator 22 associated with the load circuit are added. The load circuit 23 is formed of NMOS transistors N7 and N8 connected between a power supply (VCC) node and the data input/output line pair on the data bus side with respect to the column selection gate 18 in the data bus region, for example, and the impedance thereof can be controlled from the exterior by supplying a load control signal LDE to the gates of the NMOS transistors N7 and NS. The load control signal LDE is created by the internal control signal generator 22a according to a DRE (data latch refresh enable) signal and a/WE (write enable) signal.

At the time of refreshing operation of the data latch circuit 16a, the load control signal LDE is set to VCC ("H" level) to set the load circuit 23 into the low impedance state and the MOS transistors N5 and N6 for the column selection gate are set into the ON state by the CSL signal so that a current will be caused to flow from the VCC node into the data latch circuit 16a via the NMOS transistors N7 and N8 for the load element and the MOS transistors N5 and N6 for the column selection gate to charge the potential of one of the first and second data storing and holding nodes D and /D which is higher than the other. At this time, the transfer gate control signal XFER is set to the "L" level to set the MOS transistors N1 and N2 for the transfer gate into the OFF state so that the data latch circuit 16a will be isolated from the sense amplifier 14. As a result, it becomes possible to independently effect the refreshing operation of the DRAM cell array 13 and the refreshing operation of the data latch circuit 16a.

Therefore, the potential of one of the two data storing and holding nodes D and /D in the dynamic latch circuit 16a which is higher than the other is raised to VCC-VTN3-VTN2 (VTN3 is a gate threshold voltage of the MOS transistors N7 and N8 for the load element, and VTN3 is a gate threshold voltage of the MOS transistors N5 and N6 for the column selection gate) by charging the stray capacitance. In the above refreshing system, since it is not necessary to previously read out data of the same row address as that of data latched in the data latch circuit 16a from the DRAM cell array 13 and latch the readout data in the sense amplifier 14, the refresh control can be easily effected, thereby increasing the flexibility in the design of the system operation.

Further, if the gate potentials of the MOS transistors N5 and N6 for the column selection gate are controlled by the internal control signal generator 22 so as to be raised to a potential higher than VCC, the potential of one of the two data storing and holding nodes D and /D in the latch circuit 16a which is higher than the other becomes higher than (VCC-VTN3-VTN2), thereby enhancing the write-in margin.

According to the DRAM with data latch of the first and second embodiments, since the MOS transistors N3, N4 of the same conductivity type are used in the data latch circuit 16a and MOS transistors of different conductivity types are not used, it becomes unnecessary to provide an isolation region for electrically isolating the MOS transistors of different conductivity types from each other. Further, the data latch circuit 16a has a simple construction formed of two MOS transistors which are cross-coupled. Therefore, the possibility that the chip size of the DRAM is significantly increased will not occur.

(Embodiment 3)

Next, a DRAM with data latch according to the third embodiment of this invention is explained. This embodiment is a modification of the second embodiment and the construction of a bit line pair (BL, /BL), sense amplifier 14, transfer gate 15, data input/output lines (DL, /DL), data latch circuit 16a, load circuit 23b and column selection gate 18 in one column of the DRAM cell array is shown in FIG. 7.

The above circuit is similar to the circuit of FIG. 5 except that PMOS transistors P7, P8 are used as two MOS transistors for the load element in the load circuit 23b. Further, since the control signal generator can be constructed in the same manner as shown in FIG. 5 except that the activation levels of the load circuit 23b are inverted, the explanation therefor is omitted.

The operation of the above circuit is similar to the operation of the circuit of FIG. 5 except that the operation of refreshing latch data is slightly different. That is, in the operation of refreshing latch data, since the potential of one of the two data storing and holding nodes D and /D in the latch circuit 16a which is higher than the other is charged to (VCC-VTN2) which is higher than (VCC-VTN3-VTN2) in the second embodiment, the write-in margin of the node on the higher potential side is made larger than that of the circuit of FIG. 5. In this case, if the gate potentials of the MOS transistors N5, N6 for the column selection gate are raised to a potential higher than VCC as described before, the write-in margin of the node-on the higher potential side can be made still larger.

Further, in this embodiment, only the load circuit 23 uses the PMOS transistors and an N well is necessary for element isolation, but since the load circuit 23 is not formed in the core portion in which the circuits (for example, the sense amplifier 14, transfer gate 15, data latch circuit 16, and column selection gate 18) corresponding to each row of the DRAM cell array are formed, but is formed in the peripheral portion, the chip size will not be significantly increased.

(Embodiment 4)

Next, a DRAM with data latch according to the fourth embodiment of this invention is explained. In FIG. 8, the construction of a bit line pair (BL, /BL), sense amplifier 14, transfer gate 15, data input/output lines (DL, /DL), data latch circuit 16b, load circuit 23, column selection gate 18 and a control circuit for controlling the above elements in one column of the DRAM cell array is shown.

This embodiment is similar to the first embodiment except the construction of the data latch circuit 16 and that the load circuit 23 is connected to the data input/output line pair DL, /DL on the data latch circuit side with respect to the column selection gate.

The data latch circuit 16b includes first and second NMOS transistors N11 and N12 for access whose drains are respectively connected to the data input/output lines DL and /DL and whose gates are supplied with a latch control signal LE and first and second NMOS transistors N13 and N14 for the driver whose drains are respectively connected to the sources of the NMOS transistors N11 and N12, whose sources are connected to a VSS node, and whose gates are cross-coupled with the drains of the two NMOS transistors for access.

Figure 9A:
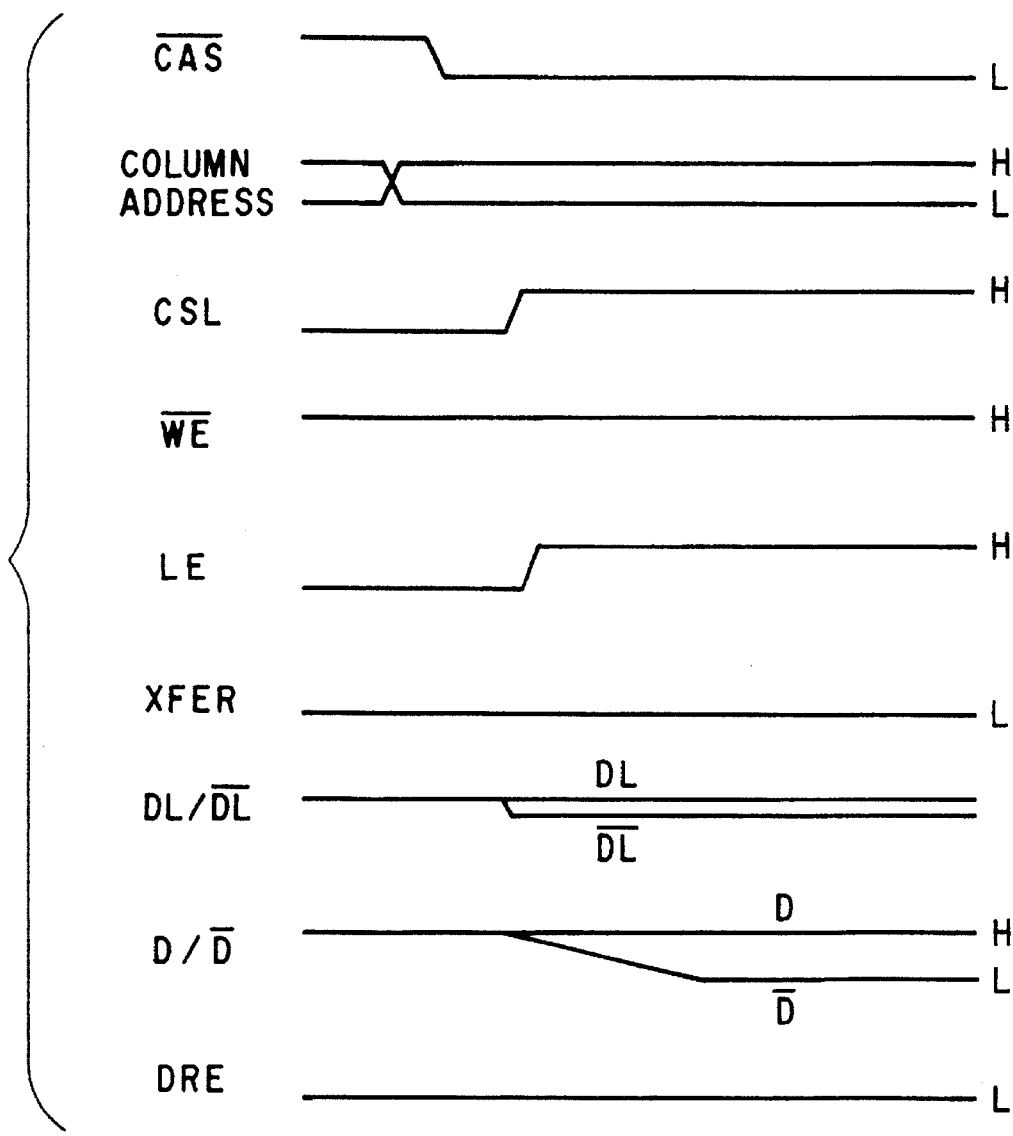
FIGS. 9A to 9C are timing charts for illustrating the refreshing operation of the data latch circuit of the fourth embodiment, FIG. 9A showing the operation at the time of readout from the data latch circuit, FIG. 9B showing the operation at the time of writing into the data latch circuit, and FIG. 9C showing the operation at the time of refreshing of the data latch circuit.
Figure 9B:
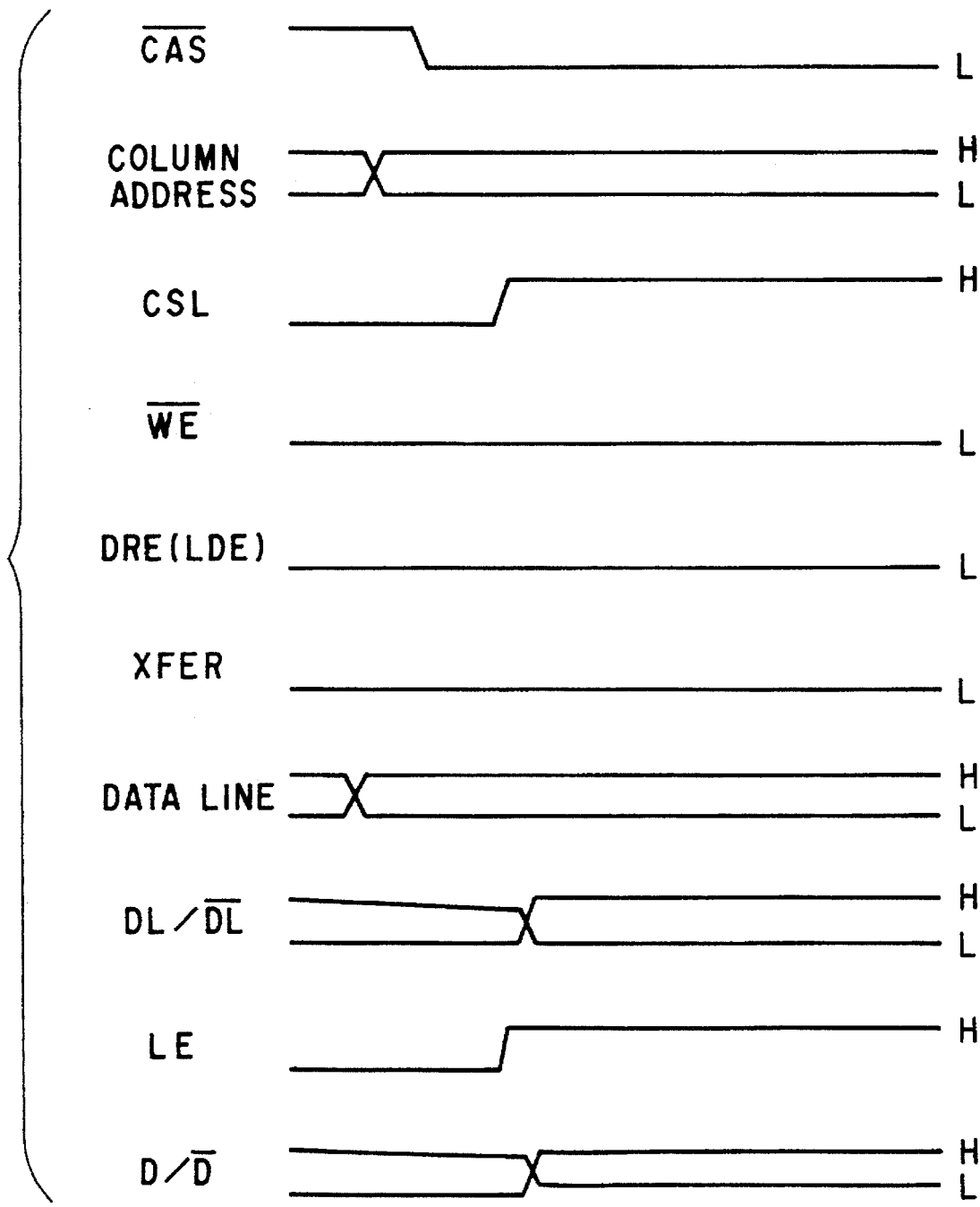
Figure 9C:
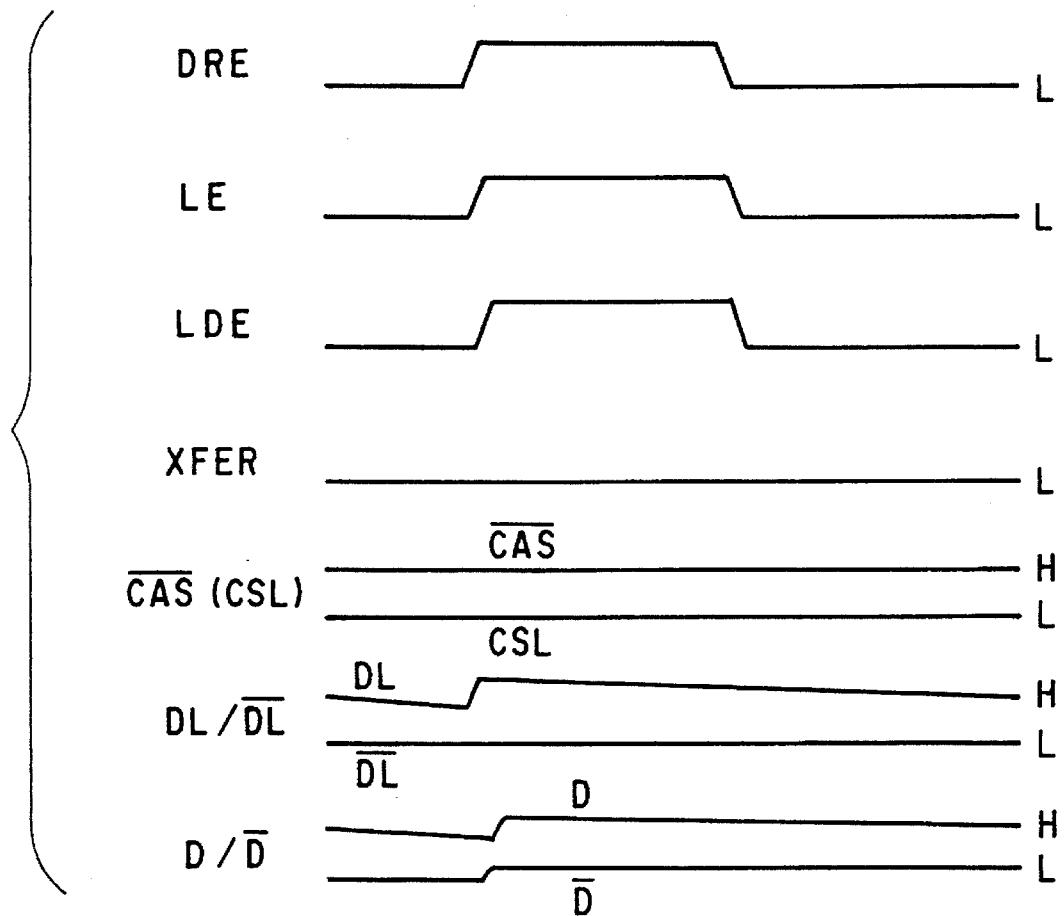

Next, the operation of the circuit of FIG. 8 is explained. Timing charts for illustrating the operation are shown in FIGS. 9A to 9C, FIG. 9A showing timings at the time of readout, FIG. 9B showing timings at the time of write-in, and FIG. 9C showing timings at the time of refreshing.

At the time of data readout from the data latch circuit 16b, the transfer gate 15 is turned off by a signal XFER and the column selecting operation is effected by the column selection gate 18. Further, the data latch circuit 16b is activated by a signal LE and the load circuit 23 is set into the ON state by a signal LDE. The signals LE and LDE are created by the internal control signal generator 22b based on signals DRE and /WE. At this time, data readout from the data latch circuit 16b is effected by the current driving in the data input/output line pair DL, /DL by use of the NMOS transistors N13 and N14 for the driver of the data latch circuit 16b like the case of readout of cell data in a general static RAM.

At the time of writing data into the data latch circuit 16b, the transfer gate 15 is turned off by the signal XFER and the column selecting operation is effected by the column selection gate 18. Further, the data latch circuit 16b is activated by the signal LE and the load circuit 23 is set into the OFF state by the signal LDE. Then, data is written into the data latch circuit 16b from the input/output buffer 20 side via the data bus 19.

At the time of refreshing of latch data, the transfer gate 15 is turned off by the signal XFER, the data latch circuit 16b is activated by the signal LE and the load circuit 23 is set into the ON state by the signal LDE. As a result, the potential of one of the two data storing and holding nodes D and /D in the data latch circuit 16a which is higher than the other is raised to a potential which is lower than the potential of the higher potential side data input/output line DL or /DL by the gate threshold voltage of the higher potential side transistor N11 or N12 for access. That is, at the time of data readout described above, the same state is set up and the latch data refreshing operation is automatically effected.

As described above, the refresh control for the circuit of FIG. 8 is simple and can be effected independently from the operations of the DRAM cell array 13 and sense amplifier 14 with the transfer gate 15 closed so that the flexibility in the design of the system operation of the memory can be increased.

That is, unlike the latch data refreshing system of the first embodiment described with reference to FIG. 3, it becomes unnecessary to discard data latched by the sense amplifier 14 and it becomes possible to open the transfer gate 15 immediately after the latch data refreshing operation is completed and transfer data of the sense amplifier 14 to the data latch circuit 16b.

Like the case of the DRAM with latch circuit in the former embodiment, when the circuit of FIG. 8 is used, the chip size of the DRAM will not be significantly increased since the data latch circuit 16b is constructed by the MOS transistors N11 to N14 of the same conductivity type.

(Embodiment 5)

Next, a DRAM with data latch according to the fifth embodiment of this invention is explained. This embodiment is a modification of the fourth embodiment and the construction of a bit line pair (BL, /BL), sense amplifier 14, transfer gate 15c, data input/output lines (DL, /DL), data latch circuit 16c, load circuit 23c, and column selection gate 18c is shown in FIG. 10.

This embodiment is similar to the fourth embodiment explained with reference to FIG. 8 except that PMOS transistors are used as MOS transistors for the transfer gate 15c, MOS transistors for the data latch circuit 16c, MOS transistors for the column selection gate 18c and MOS transistors for the load circuit 23. The data latch circuit 16c is connected between a VCC node and the data input/output line pair DL, /DL, the load circuit 23c is connected between the data input/output line pair DL, /DL and a VSS node, and the activation/de-activation levels of control signals therefor are inverted. Since a control signal generator can be constructed in the same manner as in the case of FIG. 8 simply by inverting the "H" and "L" levels of the control signal, the construction thereof is omitted.

Also, in this embodiment, like the operation of the fourth embodiment explained with reference to the circuit of FIG. 8, the refresh control can be extremely easily effected, the flexibility in the design of the system operation of the memory can be increased, and the chip size of the DRAM will not be significantly increased.

(Embodiment 6)

Figure 11:
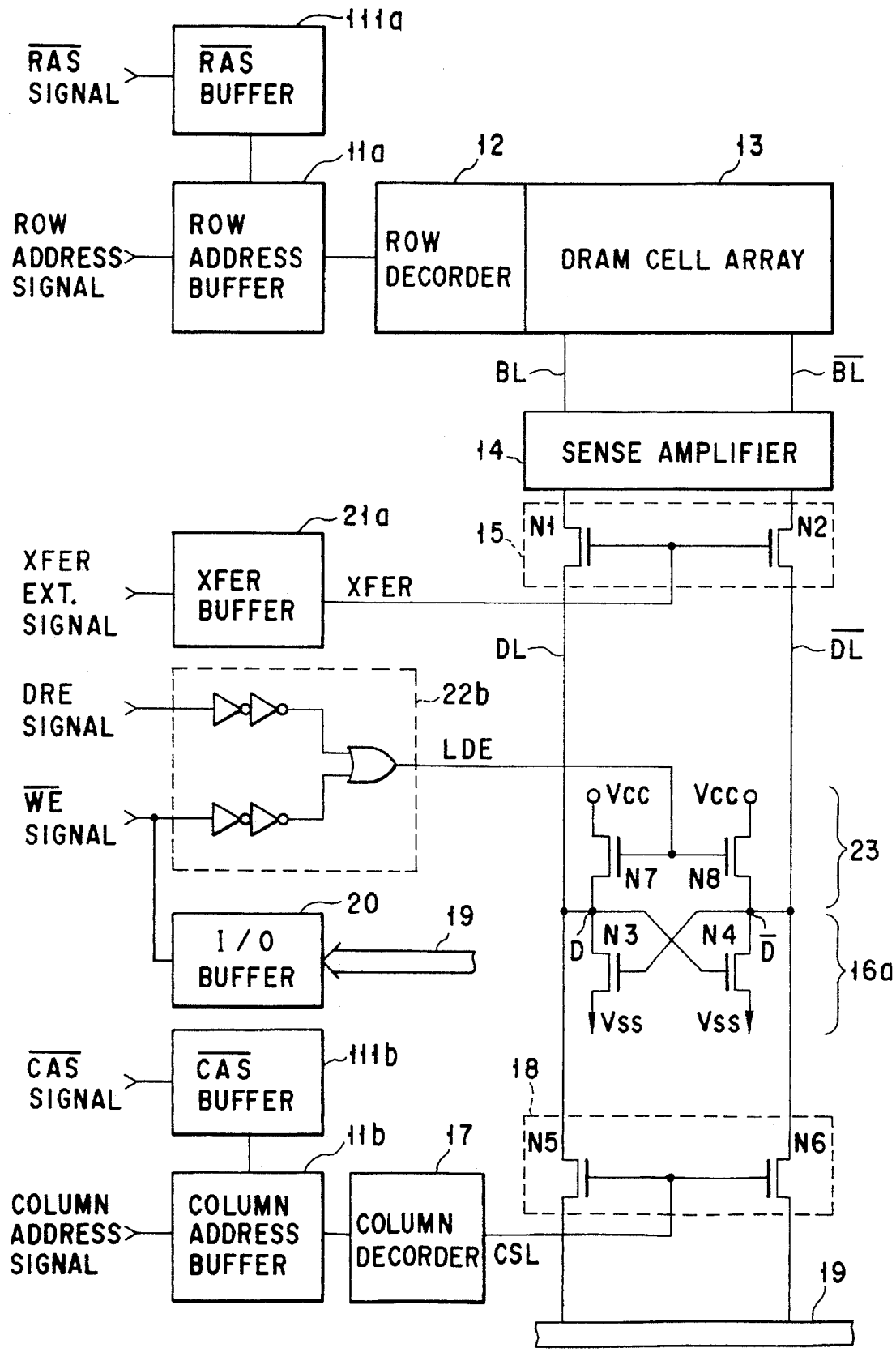
FIG. 11 is a circuit diagram (partially block diagram) showing an example of a sense amplifier, transfer gate, data input/output line, data latch circuit, column selection gate, load circuit and a control circuit for controlling the above elements in one column of a DRAM cell array according to a sixth embodiment of this invention.

Next, a DRAM with data latch according to the sixth embodiment of this invention is explained. In FIG. 11, the construction of a bit line pair (BL, /BL), sense amplifier 14, transfer gate 15, data input/output lines (DL, /DL), data latch circuit 16a, load circuit 23, column selection gate 18 and a control signal generator for the above elements in one column of the DRAM cell array is shown.

This embodiment is similar to the fourth embodiment of FIG. 8 except the construction of the data latch circuit 16a and the construction of the control signal generator.

Like the data latch circuit 16a in the circuit shown in FIG. 3, the data latch circuit 16a of this embodiment includes two NMOS transistors N3 and N4 for the driver which are cross-coupled to the data input/output lines DL and /DL and the NMOS transistors N3 and N4 for the driver are designed to have a larger driving ability than NMOS transistors N7 and N8 for the load in the load circuit 23.

Next, the operation of the circuit of FIG. 11 is explained. Timing charts therefor are the same as those shown in FIG. 6.

At the time of data readout from the data latch circuit, the transfer gate 15 is turned off by a signal XFER and the column selection gate 18 is activated so as to effect the column selecting operation. Further, the load circuit 23 is set into the ON state by a control signal LDE which is generated from an internal control signal generator 22b according to a DRE signal and /WE signal. At this time, like the data readout operation in the circuit of FIG. 8, data readout from the data latch circuit 16a is effected by the current driving in the data input/output line pair DL, /DL by use of the NMOS transistors N3 and N4 for the driver of the data latch circuit 16a.

At the time of writing data into the data latch circuit, the transfer gate 15 is turned off by the signal XFER, the column selecting operation is effected by the column selection gate 18 and the load circuit 23 is set into the OFF state by the signal LDE. Then, data is written into the data latch circuit 16a from the input/output buffer 20 side via the data bus 19.

At the time of refreshing of latch data, the transfer gate 15 is turned off by the signal XFER and the load circuit 23 is set into the ON state by the signal LDE, and as a result, the potential of one of the two data storing and holding nodes D and /D in the data latch circuit 16a which is higher than the other is raised by the load circuit 23 to a potential which is lower than vcc by the gate threshold voltage of the NMOS transistor N7 or N8 for the load element.

As described above, like the circuit of FIG. 8, in the circuit of FIG. 11, the refresh control can be extremely easily attained and can be effected independently from the operations of the DRAM cell array 13 and sense amplifier 14 with the transfer gate 15 closed so that the degree of freedom in the design of the system operation of the memory can be increased and the chip size of the DRAM will not be significantly increased.

(Embodiment 7)

Next, a DRAM with data latch according to the seventh embodiment of this invention is explained. This embodiment is a modification of the sixth embodiment and the construction of a bit line pair (BL, /BL), sense amplifier 14, transfer gate 15c, data input/output lines (DL, /DL), data latch circuit 16d, load circuit 23c, and column selection gate 18c is shown in FIG. 12.

This circuit is similar to a corresponding circuit of FIG. 11 except that PMOS transistors are used as MOS transistors for the transfer gate 15c, MOS transistors for the data latch circuit 16d, MOS transistors for the column selection gate 18c and MOS transistors for the load circuit 23c, the data latch circuit 16d is connected between a Vcc node and the data input/output line pair DL, /DL, the load circuit 23c is connected between the data input/output line pair DL, /DL and a VSS node, and the activation/de-activation levels of control signals therefor are inverted. Since a control signal generator can be constructed in the same manner as in the case of FIG. 11 simply by inverting the "H" and "L" levels of the control signal, the construction thereof is omitted.

Also, in this embodiment, like the operation of the sixth embodiment explained with reference to the circuit of FIG. 11, the refresh control can be extremely easily effected, the flexibility in the design of the system operation of the memory can be increased, and the chip size of the DRAM will not be significantly increased.

As explained above by use of the seven embodiments, according to this invention, a semiconductor memory device having a dynamic data latch circuit can be attained in which the chip size of the DRAM will not be significantly increased.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A semiconductor memory cell device comprising:

a memory cell array having a plurality of dynamic memory cells arranged in a matrix form of rows and columns;

a row decoder for selecting any one of said rows in said memory cell array;

a plurality of sense amplifiers each for sensing a pair of data items read out from a corresponding one of said plurality of memory cells on a row selected by said row decoder;

a plurality of transfer gates each including a pair of first MOS transistors respectively connected to a pair of outputs of a corresponding one of said plurality of sense amplifiers;

a plurality of input/output data line pairs respectively connected to said plurality of transfer gates;

a plurality of data latch circuits each connected between two lines of a corresponding one of said plurality of input/output data line pairs, for latching data in said input/output data line pairs;

a plurality of column selection gates each including a pair of second MOS transistors being of a same conductivity type as said first MOS transistors and connected to a corresponding one of said plurality of input/output data line pairs, for selecting any one of said plurality of data latch circuits;

a data bus connected to said plurality of input/output data line pairs via said column selection gates; and a control circuit for reading out data of a same row address as that of data latched in one of said data latch circuits from said memory cell array, having the data, which is read out from said memory cell array, latched by a corresponding one of said sense amplifiers and writing the data, which is latched by said one of said sense amplifiers, into said one of said data latch circuits by controlling said first MOS transistors of a corresponding one of said transfer gates into an ON state, while controlling said second MOS transistors of a corresponding one of said column selection gates into an OFF state to isolate said one of said data latch circuits from said data bus in a refreshing operation of the data latched by said one of said data latch circuits;

wherein each of said data latch circuits includes third and fourth MOS transistors whose drains are respectively connected to said input/output data line pairs, whose sources are connected to a power supply node and whose gates are cross-coupled to the drains of said fourth and third MOS transistors, and said third and fourth MOS transistors are of the same conductivity type as said first and second MOS transistors.

2. A semiconductor device according to claim 1, wherein said first to fourth MOS transistors are of N-channel type and said control circuit also affects an operation of raising a gate potential of said first MOS transistors of each of said transfer gates to a potential higher than a power supply voltage in the refreshing operation of the data latched by said one of said data latch circuits.

3. A semiconductor memory device comprising:

a memory cell array having a plurality of dynamic memory cells arranged in a matrix form of rows and columns;

a row decoder for selecting any one of said rows in said memory cell array;

a plurality of sense amplifiers each for sensing a pair of data items read out from a corresponding one of said plurality of memory cells on a row selected by said row decoder;

a plurality of transfer gates each including a pair of first MOS transistors respectively connected to a pair of outputs of a corresponding one of said plurality of sense amplifiers;

a plurality of input/output data line pairs respectively connected to said plurality of transfer gates;

a plurality of data latch circuits each connected between two lines of a corresponding one of said plurality of input/output data line pairs, for latching data in said input/output data line pairs;

a plurality of column selection gates each including a pair of second MOS transistors being of a same conductivity type as said first MOS transistors and connected to a corresponding one of said plurality of input/output data line pairs, for selecting any one of said plurality of data latch circuits;

a data bus connected to said plurality of input/output data line pairs via said column selection gates;

a plurality of load circuits which are each connected between a corresponding one of a plurality of input/output data line pairs of said data bus and a first power supply node whose impedance can be controlled from an exterior; and a control circuit for injecting charges from one of said circuits into a corresponding one of said data latch circuits by setting said one of said load circuits into a low impedance state and controlling said second MOS transistors of a corresponding one of said column selection gates into an ON state, while controlling said first MOS transistors of a corresponding one of said transfer gates into an OFF state to isolate said one of said data circuits from a corresponding one of said sense amplifiers in a refreshing operation of the data latched by said one of said data latch circuits;

wherein each of said data latch circuits includes third and fourth MOS transistors whose drains are respectively connected to said input/output data line pairs, whose sources are connected to a second power supply node and whose gates are cross-coupled to the drains of said fourth and third MOS transistors, and said third and fourth MOS transistors are of the same conductivity type as said first and second MOS transistors.

4. A semiconductor device according to claim 3, wherein said first to fourth MOS transistors are of N-channel type and said control circuit also raises a gate potential of said second MOS transistors of each of said column selection gates to a potential higher than a power supply voltage in the refreshing operation of the data latched by said one of said data latch circuits.

5. A semiconductor memory device comprising:

a memory cell array having a plurality of dynamic memory cells arranged in a matrix form of rows and columns;

a row decoder for selecting any one of said rows in said memory cell array;

a plurality of sense amplifiers each for sensing a pair of data items read out from a corresponding one of said plurality of memory cells on a row selected by said row decoder;

a plurality of transfer gates each including a pair of first MOS transistors respectively connected to a pair of outputs of a corresponding one of said plurality of sense amplifiers;

a plurality of input/output data line pairs respectively connected to said plurality of transfer gates;

a plurality of data latch circuits each connected between two lines of a corresponding one of said plurality of input/output data line pairs, for latching data in said input/output data line pairs;

a plurality of column selection gates each including a pair of second MOS transistors an being of a same conductivity type as said first MOS transistors and connected to a corresponding one of said plurality of input/output data line pairs, for selecting any one of said plurality of data latch circuits;

a plurality of load circuits which are each connected between a corresponding one of a plurality of input/output data line pairs of said data bus and a first power supply node whose impedance can be controlled from an exterior;

a data bus connected to said plurality of input/output data line pairs via said column selection gates; and a control circuit for injecting charges from one of said load circuits into a corresponding one of said data latch circuits by setting said one of said load circuits into a low impedance state and activating said one of said data latch circuits, while controlling said first MOS transistors of a corresponding one of said transfer gates into an OFF state to isolate said one of said data latch circuits from a corresponding one of said sense amplifiers in a refreshing operation of the data latched by said one of said data latch circuits;

wherein each of said data latch circuits includes first and second accessing MOS transistors whose drains are each connected to a corresponding line of said input/output data line pairs and whose gate electrodes are supplied with a latch control signal; and first and second driving MOS transistors whose drains are connected to sources of said first and second accessing MOS transistors, whose sources are connected to a second power supply node and whose gate electrodes are cross-coupled to the drains of said second and first driving MOS transistors; and said first and second accessing MOS transistors are of the same conductivity type as said first and second MOS transistors.

6. A semiconductor memory device comprising:

a memory cell array having a plurality of dynamic memory cells arranged in a matrix form of rows and columns;

a row decoder for selecting any one of said rows in said memory cell array;

a plurality of sense amplifiers each for sensing a pair of data items read out from a corresponding one of said plurality of memory cells on a row selected by said row decoder;

a plurality of transfer gates each including a pair of first MOS transistors respectively connected to a pair of outputs of a corresponding one of said plurality of sense amplifiers;

a plurality of input/output data line pairs respectively connected to said plurality of transfer gates;

a plurality of data latch circuits each connected between two lines of a corresponding one of said plurality of input/output data line pairs, for latching data in said input/output data line pairs;

a plurality of column selection gates each including a pair of second MOS transistors connected to a corresponding one of said plurality of input/output data line pairs, for selecting any one of said plurality of data latch circuits;

a plurality of load circuits which are each connected between a corresponding one of a plurality of input/output data line pairs of said data bus and a first power supply node whose impedance can be controlled from an exterior;

a data bus connected to said plurality of input/output data line pairs via said column selection gates; and a control circuit for injecting charges from one of said load circuits into a corresponding one of said data latch circuits by setting said one of said load circuits into a low impedance state and activating said one of said data latch circuits; while controlling said first MOS transistors of a corresponding one of said transfer gates into an OFF state to isolate said one of said dater latch circuits from a corresponding one of said sense amplifiers in a refreshing operation of the data latched by said one of said data circuits;

wherein each of said data latch circuits includes third and fourth MOS transistors whose drains are respectively connected to said input/output data line pairs, whose sources are connected to a second power supply node and whose gates are cross-coupled to the drains of said fourth and third MOS transistors.

* * * * *